United States Patent [19]

Sato et al.

[11] Patent Number: 4,680,477

[45] Date of Patent: Jul. 14, 1987

[54] CONTACT TYPE DOCUMENT READING DEVICE WITH UNIFORM LINE-TO-LINE CONDUCTOR CAPACITANCE

[75] Inventors: Shigeru Sato; Takashi Ozawa, both of Ebina, Japan

[73] Assignee: Fuji Xerox Co. Ltd., Tokyo, Japan

[21] Appl. No.: 745,880

[22] Filed: Jun. 18, 1985

[30] Foreign Application Priority Data

Jun. 22, 1984 [JP] Japan ................. 59-128923

[51] Int. Cl.[4] .............................................. H01J 40/14
[52] U.S. Cl. ....................................... 250/578; 357/30; 357/68; 361/404
[58] Field of Search ............... 250/578; 357/30, 31, 357/32, 45, 68; 358/213, 212; 361/404, 406, 409

[56] References Cited

U.S. PATENT DOCUMENTS 4,617,471 10/1986 Suzuki et al. .................... 250/578

Primary Examiner—David C. Nelms
Assistant Examiner—S. Allen
Attorney, Agent, or Firm—Handal & Morofsky

[57] ABSTRACT

A document reading device of a charge storage type comprising a plurality of light receiving elements arranged on a substrate in a main scanning direction of a document and a plurality of wiring conductor lines for electrically connecting between the light receiving elements and drive elements, wherein the plurality of conductor lines are made different in their width in accordance with their wiring position to thereby make line-to-line capacitances of the conductor lines substantially the same, thus making the same capacitances appearing between the light receiving elements and drive elements for all bits.

5 Claims, 12 Drawing Figures

CONTACT TYPE DOCUMENT READING DEVICE WITH UNIFORM LINE-TO-LINE CONDUCTOR CAPACITANCE

BACKGROUND OF THE INVENTION

1. Field of the Invention

The present invention relates to a contact type document reading device which is built in a facsimile equipment or the like to read a document, and more specifically, to an improvement in the wiring arrangement of conductors used to electrically connect a multiplicity of light receiving elements and driving elements for driving the light receiving elements.

2. Description of the Prior Art

FIG. 1 shows an equivalent circuit of a general document reading device of the type referred to above, and FIG. 2 schematically shows the structure of a light receiving section 100 in the device of FIG. 1. More particularly, as shown by a fragmentary plan view in FIG. 2(a) and by a sectional view in FIG. 2(b), the light receiving section 100 comprises divided electrodes $1n1$ (111, 121, 131, 141, . . . ) of thin films made of an electrically conductive material such as Al, Cr or Au; a photoconductive thin film or layer 102 made of an amorphous semiconductor such as Se-As-Te or a-Si or of a polycrystalline semiconductor such as CdS or CdSe; and a transparent film or electrode 103 made of an electrically conductive transparent material such as $SnO_2$ or ITO; the divided electrodes $1n1$, photoconductive layer 102 and transparent electrode 103 being laminated sequentially on an insulating substrate BD made of glass or ceramic. That is, the photoconductive layer 102 is sandwiched by two types of electrodes, i.e., the divided electrodes $1n1$ and transparent electrode 103. The light receiving section 100 is represented by an equivalent parallel circuit of a photodiode PD and a capacitor C as shown in FIG. 1. Consider a light receiving element 110, for example. The capacitor C of the element 110 is a sum of the capacity of the element 110 itself and the capacity which a conductor 210 has. These light receiving elements 110, 120, . . . $1n0$ are arranged by a predetermined number which provide a density (for example, 8 dots/mm) necessary for desirable document resolution, in its main scanning direction.

The operation of the document reading device will next be explained briefly by referring to FIG. 1. In the drawing, when a shift register 500 is driven first time and MOS FETs 310, 320, . . . $3n0$ are sequentially turned ON and OFF, closed loops will be accordingly established sequentially between a power source PS and the light receiving elements 110, 120, . . . $1n0$, so that a predetermined amount of charge will be stored in the capacitor C. In a document reading mode, the charges stored in these capacitors C will be discharged or held therein depending on the amount of lights received at the associated photodiodes PD. Thereafter when the shift register 500 is driven second time to sequentially turn ON and OFF the MOS FETs 310, 320, . . . $3n0$ to again charge the capacitors C, a current corresponding to the amount of charge stored in the capacitor C of each light receiving element will flow through a signal line 600. This current is sent from an output terminal OUT as a read signal of the document reading device. Such operation will be repeatedly executed for each scanning of the reading document. Such a document reading device as described above as generally called charge storage type document reading device.

In the document reading device, the light receiving section 100 is constructed by an array of the divided electrodes $1n1$, photoconductive layer 102 and transparent electrode 103 sequentially provided on the same insulating substrate BD by means of an evaporation process, a sputtering process, a CVD or the like processes. Since the MOS FETs 310, 320, . . . $3n0$ and the shift register 500 are separately formed, means for electrically connecting at least between the light receiving element 110, 120, . . . $1n0$ and MOS FETs 310, 320, . . . $3n0$ must be provided on the substrate BD or another substrate by wire bonding or like bonding means. That is wiring conductors 210, 220, . . . $2n0$ for connection between the light receiving elements 110, 120, . . . $1n0$ and the MOS FETs 310, 320, . . . $3n0$ must be provided therebetween by the aforementioned wire bonding or like bonding means. In practice, the wired conductors 210, 220, . . . $2n0$ become considerably long.

In view of such circumstances, in the prior art contact type document reading device, efforts were made that the conductors connecting between the light receiving elements and drive elements such as MOS FETs are made as short as possible and yet have sufficient allowable width and conductor-to-conductor (line-to-line) spacing. However, as the number of light receiving elements for the drive elements is increased and therefore the light receiving element array becomes longer, variation of the line-to-line capacities among the conductors become great, and, undesirable effect on the document reading operation will occur through the light receiving elements.

FIG. 3 shows a circuit diagram for explaining the principle of the document reading device corresponding to one bit, in which elements having substantially the same functions as those in FIG. 1 are denoted by the same reference numerals or symbols. In FIG. 3, the capacitance of the storage capacitor C usually consists dominantly of the line-to-line capacity of a wiring conductor section 200. For this reason, when the line-to-line capacity of the conductor section 200 greatly varies from bit to bit, the light receiving elements will produce a read signal having an irregular level. This results in that, even if a completely white (or black) line is scanned, the document reading device will produce an unstable read signal as shown, for example, in FIG. 4. As a result, in the prior art document reading device, it has been indispensable to provide a proper level correcting circuit to correct the irregular output signal.

SUMMARY OF THE INVENTION

A primary object of the present invention is, therefore, to prevent the irregular level of a document read output signal resulting from the improper wiring pattern of the conductors.

In accordance with the present invention, utilizing the fact that, since the aforementioned wiring conductor section is usually provided in the form of a film having a thickness of several μm at most, the line-to-line capacity consists dominantly of a line-to-line capacity due to the presence of the conductors on the same plane rather than the line-to-line capacity due to the presence of the conductors on opposing planes; (1) the widths of the conductors are made different depending on their wiring position, (2) the lengths of the conductors are all made the same, (3) the conductor lines are respectively provided with capacity correction conductors having a shape and an area determined by their position, and (4) the conductor line are covered with an insulator having a high specific inductive capacity and having different thicknesses and areas according to their wiring position. Such arrangement enables substantially the same line-to-line capacity by virtue of the presence of the conductors on the same plane.

As a result, all the bits can have substantially the same capacitance between the light receiving elements and drive elements and thus the light receiving elements can produce a read signal having a regular or constant level.

In this manner, according to the document reading device of the present invention, a stable read output can be obtained without additionally providing such a level correcting circuit as mentioned above, resulting advantageously in its low cost.

DESCRIPTION OF THE PREPARED EMBODIMENTS

Figure 1:
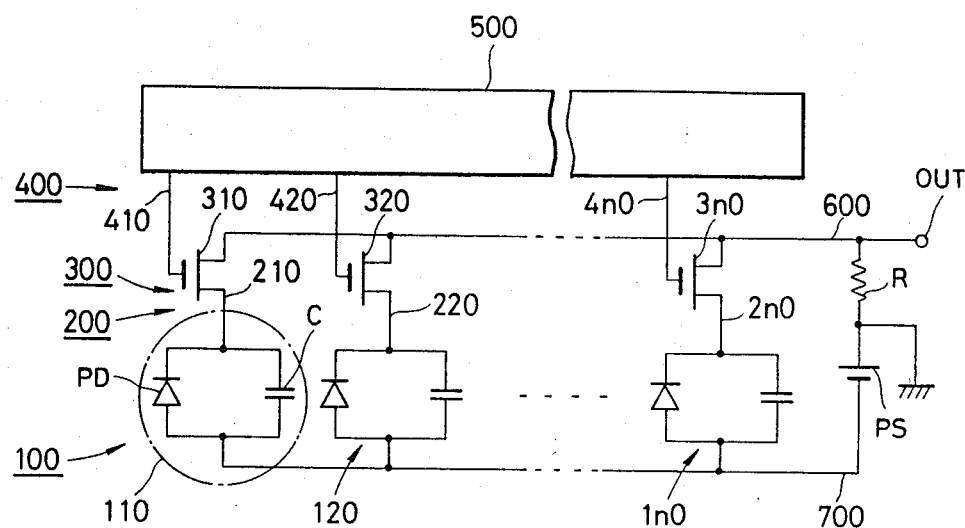
FIG. 1 is an equivalent circuit diagram of an ordinary document reading device to which the present invention is to be applied.
Figure 2:
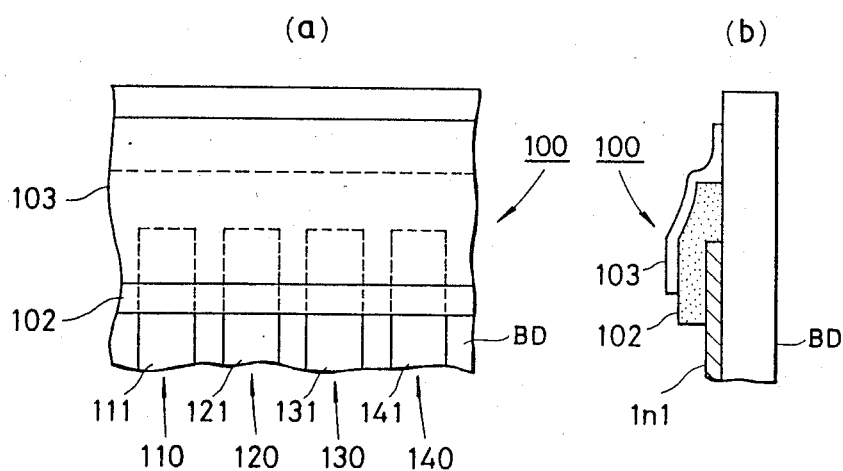
FIG. 2 schematically shows a structure of a light receiving station in the document reading device.
Figure 3:
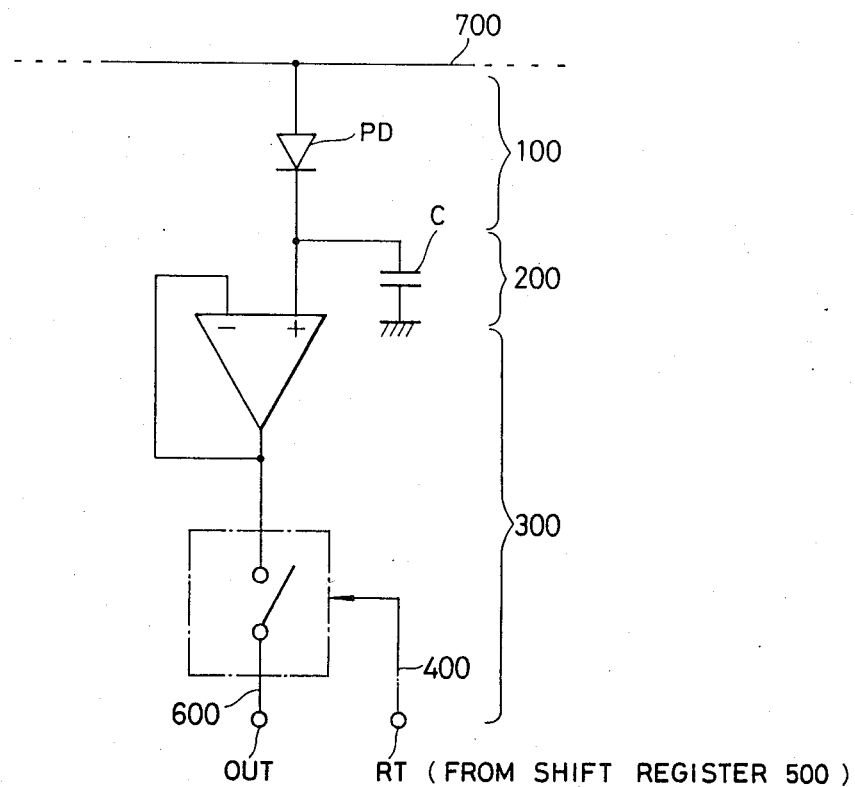
FIG. 3 is an equivalent circuit of a part of the document reading device corresponding to one bit for explanation of its principle.
Figure 4:
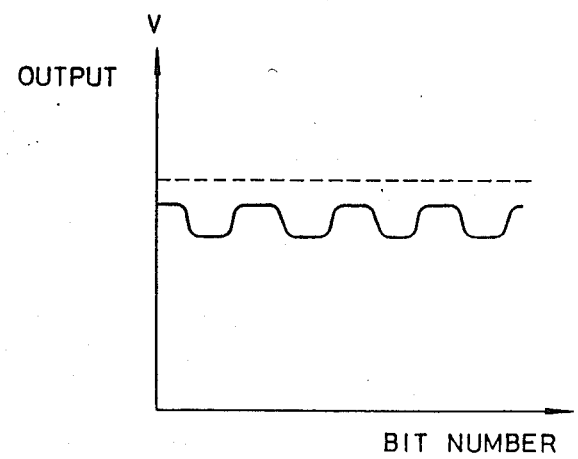
FIG. 4 is a graph showing, as an example, the output characteristic of a prior art document reading device.
Figure 5:
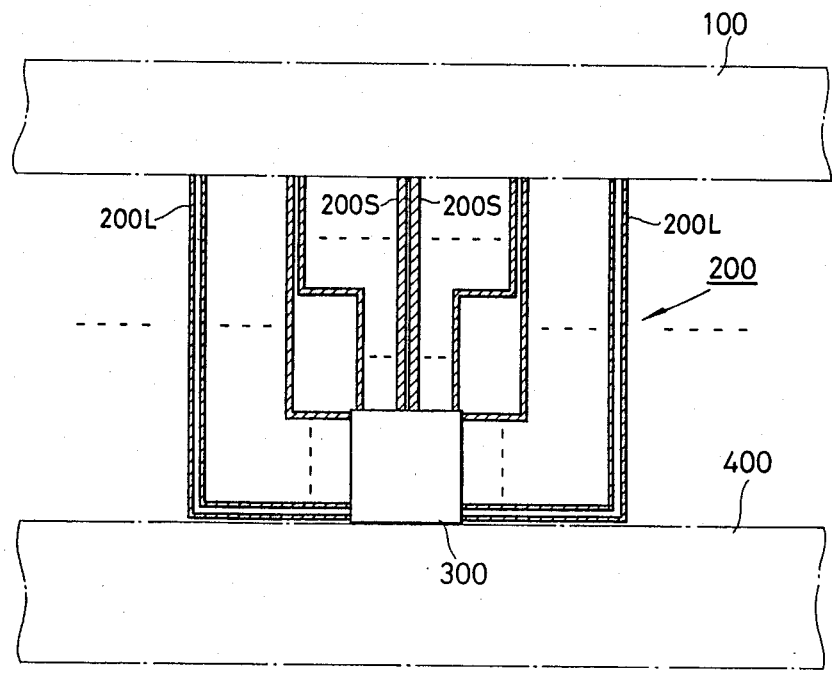
FIG. 5 is a plan view of a wiring pattern of conductors in a document reading device according to an embodiment of the present invention.

Referring first to FIG. 5, there is shown an embodiment of a document reading device of the present invention, in which elements having substantially the same functions as those in FIGS. 1 to 3 are denoted by the same reference numerals and explanation thereof is omitted.

In this embodiment, 128 (for example) of the light receiving elements are assigned to each of the drive elements 300 arranged in parallel positional relation. Assuming that conductors in the conductor group 200 electrically connecting between the light receiving elements in the light receiving section 100 and the drive element 300 are provided at a density of, for example, 4 conductors/mm according to a desired resolution of the light receiving section 100, the widths of the conductors are made different according to their lengths which are determined by their wiring position, whereby the line-to-line capacitances of the wiring conductor group 200 are made substantially the same.

More specifically, as shown in FIG. 5, conductors 200S having the shortest length are set to be largest in width in the range not exceeding its allowable upper limit and conductors 200L having the longest line length are set to be smallest in width in the range not exceeding its allowable lower limit. Further, the widths of conductors located between the conductors 200S and 200L are sequentially determined experimentally or by computation so that line-to-line capacitances established by the adjacent conductors are substantially the same, on the basic of either one of the conductors 200S and 200L or any one of conductors located therebetween.

Now, detailed explanation will be made as to how to make the embodiment device, that is, how to determine the widths of the conductors in the conductor group 200, by referring to FIGS. 6 to 8.

For brevity of the explanation, explanation will be made as to only the conductors 210 and 220 shown in FIGS. 6 and 7. First, how to calculate the line-to-line capacitance between the conductors 210 and 220 will be explained.

Figure 7:
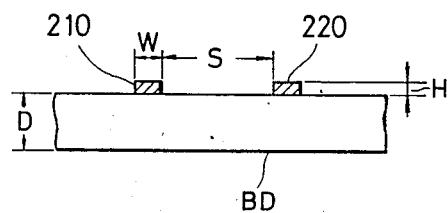
Figure 8:
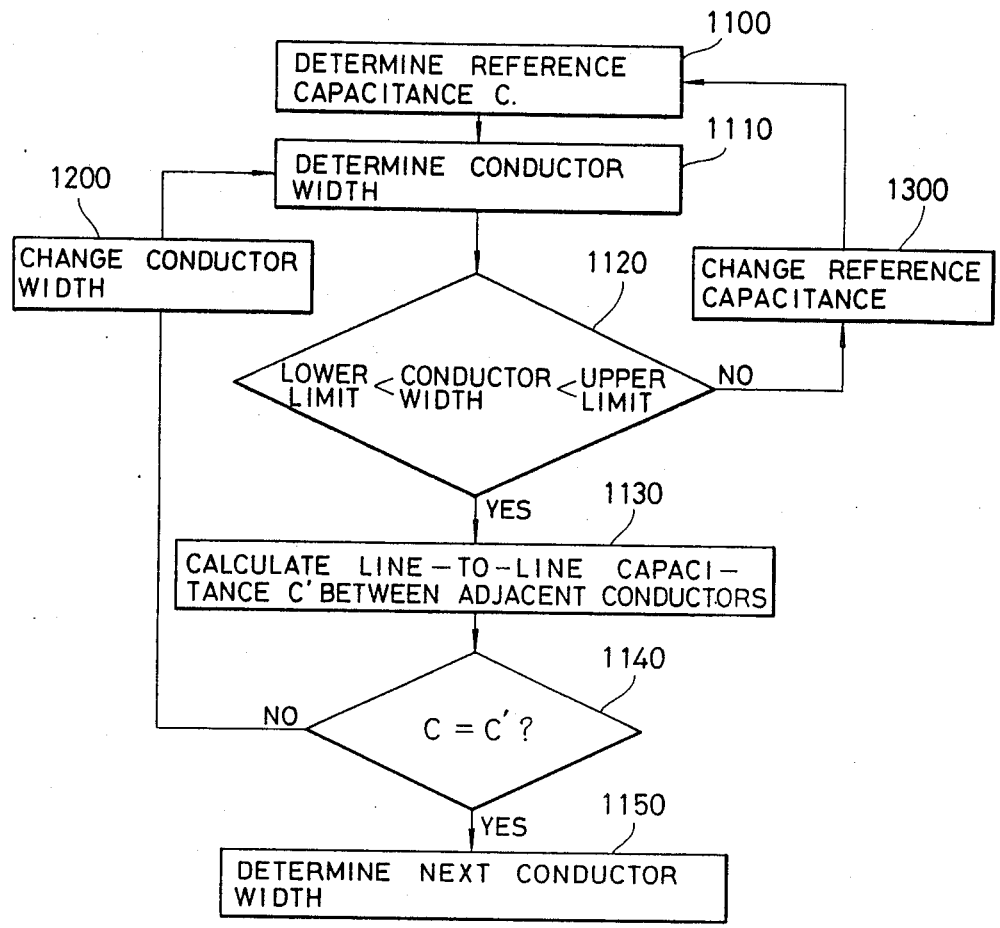
FIG. 8 is a flow chart showing how to determine the width of each of the conductors.

As seen from FIG. 7, assume that S is a distance between the conductors 210 and 220, W is the width of the conductors 210 and 220 and D is the thickness of the insulating substrate BD. Further, assume that $\epsilon_s$ is the specific inductive capacitance of the substrate BD, the thickness H of the conductors 210 and 220 is negligible because of its very small value as mentioned earlier, and electric lines of force appearing on the side of the substrate BD all pass through the substrate BD. Then the capacity C between the conductors 210 and 220 per unit length is given by the following equation.

$$C = \frac{1}{7.2\pi} \left( \epsilon_s \frac{K_1'}{K_1} + \frac{K_2'}{K_2} \right) \text{ (pF/cm)} \quad (1)$$

where, $K_1$ and $K_1'$ are expressed as follows:

$$K_1 = \int_0^1 \frac{dZ}{\sqrt{(1 - Z^2)(1 - k_1^2 Z^2)}}$$

$$K_1' = \int_0^1 \frac{dZ}{\sqrt{(1 - Z^2)(1 - (k_1')^2 Z^2)}}$$

$$k_1 = \frac{1 - \sqrt{\lambda}}{1 + \sqrt{\lambda}} \text{ or } \frac{1 + \sqrt{\lambda}}{1 - \sqrt{\lambda}} \quad (0 < k_1 < 1)$$

$$(k_1')^2 = 1 - k^2 \sqrt{\lambda} = \frac{\sinh\left(\frac{\pi}{2} \cdot \frac{W}{D}\right)}{\sinh\left(\frac{\pi}{2} \cdot \frac{W+S}{D}\right)}$$

Further, $K_2$ and $K_2'$ are expressed as follows:

$$K_2 = \int_0^1 \frac{dZ}{\sqrt{(1 - Z^2)(1 - k_2^2 Z^2)}}$$

$$K_2' = \int_0^1 \frac{dZ}{\sqrt{(1 - Z^2)(1 - (k_2')^2 Z^2)}}$$

$$k_2 = \frac{S}{S + 2W}$$

$$(k_2')^2 = 1 - k_2^2$$

Figure 6:
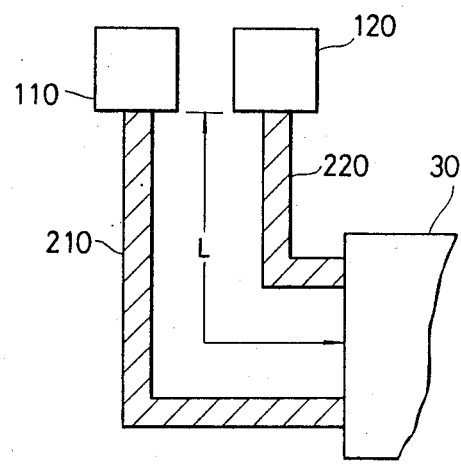
FIGS. 6 and 7 schematically show a part of the wiring conductors for calculation of respective line-to-line capacities of the conductors.

Accordingly, if the length of the conductor in question is L(cm) as shown in FIG. 6, then the line-to-line capacitance C will be written as follows:

$$C = C \times L$$

$$= \frac{1}{7.2\pi} \left( \epsilon_s \frac{K_2'}{K_1} + \frac{K_2'}{K_1} \right) L \text{(pF)} \quad (2)$$

where, $K_1$, $K_1'$, $K_2$ and $K_2'$ are respectively a complete elliptic integral.

Since the line-to-line capacitance C is found in this way, it is possible to determine the width W of the conductor necessary to obtain the constant capacitance C in the opposite way. Upon actual fabrication of this embodiment device, the wire width W is determined in accordance with such a program as shown in FIG. 8 so that the width W is between the upper and lower limits allowing the sufficiently stable reading operation of the device as explained above.

More specifically, in order to obtain a read signal having a desired level at an output terminal (corresponding to the terminal OUT in FIG. 1), the value of the capacitance C (refer to FIG. 1 or 2) (which value consists mainly of the line-to-line capacitance of the conductor group 200 as mentioned above and thus the value of the capacitance C is supposed herein to be equal to the line-to-line capacitance for brevity of the explanation) is first predetermined at a step 1100. Then the width W of the conductor in question is temporarily determined at a step 1110 and the line-to-line capacitance C' between the adjacent conductors is calculated according to the equation (2) at a step 1130. If the calculated capacitance C' is equal to the predetermined capacitance C at a step 1140, then the control goes to a step 1150 to determine the width W of the next conductor. When the capacitance C' is not equal to the capacitance C at the step 1140, on the other hand, the width W of the conductor in question is changed at a step 1200 so that the capacitance C becomes equal to the capacitance C' and the changed width is again determined at the step 1110. When the determined width W does not lie between the aforementioned upper and lower limits at a step 1120, the previously set value of the capacitance C is changed at a step 1300 to again modify the determined value of the width W.

Figure 9:
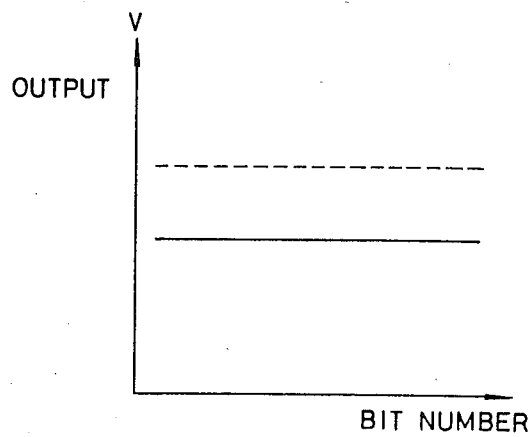
FIG. 9 is a graph showing an output characteristic of the embodiment.

When the widths of all the conductors included in the conductor group 200 are determined according to such a program, the line-to-line capacitances, that is, the values of the capacitances C shown in FIGS. 1 and 2 will become substantially the same and the document reading device can produce such a stable signal as shown in FIG. 9 with respect to such a picture element having an identical density as a completely white or black element.

Figure 10:
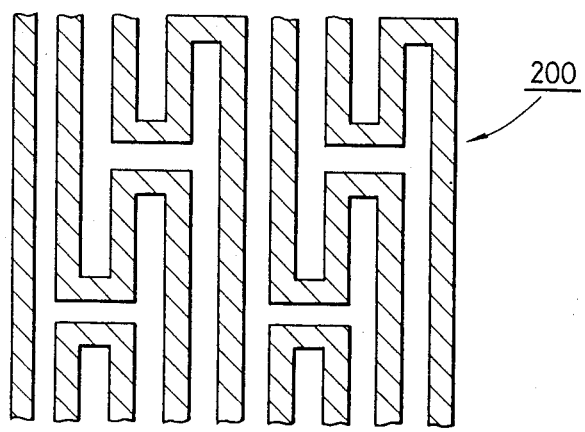
FIGS. 10, 11 and 12 show wiring patterns of conductors according to other embodiments of the document reading device of the present invention, respectively.
Figure 11:
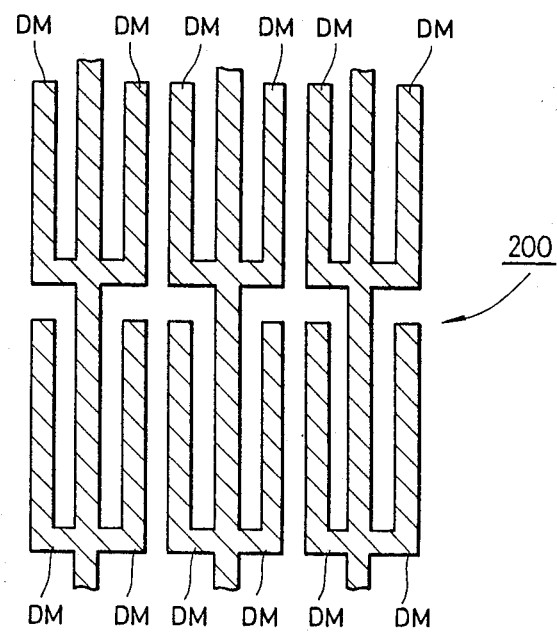

In the above embodiment, the widths of conductors provided on the substrate at a constant density, i.e., with the same number of conductors per unit substrate width have been changed depending on their wiring position in order to provide substantially the same value for all the line-to-line capacitances. However, the widths of all the conductors may be set to be the same and the lengths of the conductors may be set to be different from one another (in other words, the conductors having a relatively short distance between the light receiving elements and the drive elements are properly adjusted to be extended in a zigzag line) as shown in FIG. 10, or the conductors may be respectively provided with dummy conductors DM for adjustment of the line-to-line capacitances as shown in FIG. 11, thereby providing substantially the same value for all the line-to-line capacitances. In the both cases, the equation (2) can be used to calculate the line-to-line capacitances.

Figure 12:
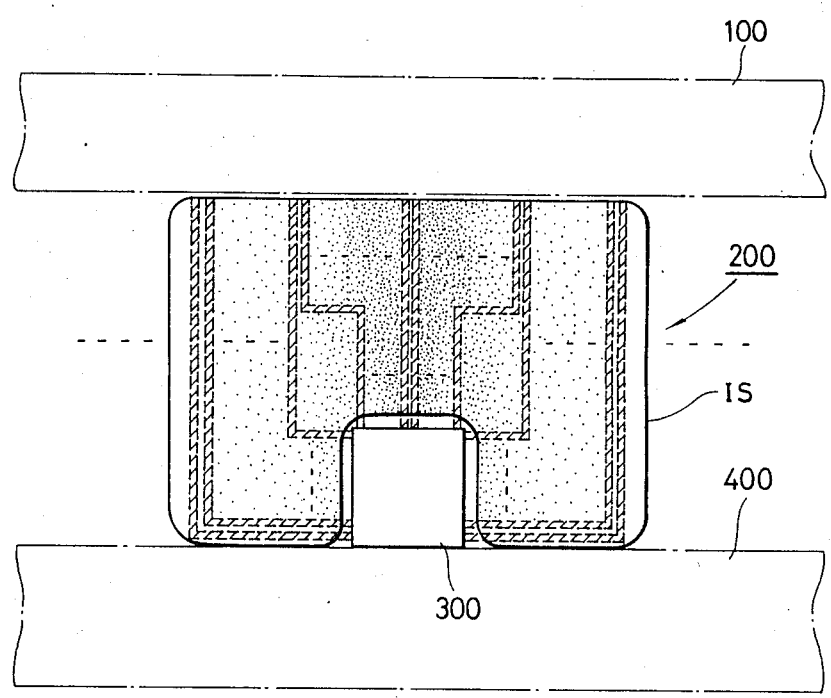

Furthermore, as shown in FIG. 12, the conductor group 200 (for example, shown in FIG. 5) may be covered at its surface with an insulator IS having a high specific inductive capacitance and the thickness and area of the insulator may be changed according to its wiring pattern, thus allowing correction of the line-to-line capacitances. In this connection, assuming that D' is the thickness of the insulator IS and $\epsilon$ is the specific inductive capacitance of the insulator, the capacitance C between the conductors (per unit length) in question will be represented by the following equation (3). (In this case, the distance between the conductors, the width of the conductors and so on are set to be the same as those in FIG. 7.)

$$C = \frac{1}{7.2\pi} \left( \epsilon_s \frac{K_1'}{K_1} + \epsilon_s \frac{K_3'}{K_3} \right) \text{(pF/cm)} \quad (3)$$

where, $K_3$ and $K_3'$, which are respectively a complete elliptic integral, are determined in the similar manner to $K_1$ and $K_1'$ of the equation (1) but using $\sqrt{\lambda} = $ $$\frac{\sinh\left(\frac{\pi}{2} \cdot \frac{W}{D'}\right)}{\sinh\left(\frac{\pi}{2} \cdot \frac{W+S}{D'}\right)}$$

In the embodiment shown in FIG. 12, as result of performing a correction over the line-to-line capacitances according to the equation (3) and making the values of the line-to-line capacitances the same, the insulator IS will become thick at its area covering the relatively short conductors while become thin at its area covering the relatively long conductors or the covering will become unnecessary.

What is claimed is:

1. A document reading device of a charge storage type comprising a plurality of light receiving elements arranged on a substrate in a main scanning direction of a document, a plurality of driving means, each driving the corresponding one of said plurality of light receiving means and a plurality of conductor means for electrically connecting between said light receiving means and driving means respectively, wherein line-to-line capacitances of said plurality of conductor means are made substantially the same.

2. A document reading device as set forth in claim 1, wherein said plurality of conductor means are made respectively different in their width in accordance with their wiring position to thereby make said line-to-line capacitances substantially the same.

3. A document reading device as set forth in claim 1, wherein said plurality of conductor means are all made the same in length to thereby make said line-to-line capacitances substantially the same.

4. A document reading device as set forth in claim 1, wherein said plurality of conductor lines are provided with capacitance correcting conductors in accordance with their wiring position to thereby make said line-to-line capacitances substantially the same.

5. A document reading device as set forth in claim 1, wherein said plurality of conductor means are covered with insulator material having a high specific inductive capacitance and the thickness and covering of said insulator material is made different for each conductor means in accordance with its wiring position, to thereby make said line-to-line capacitances substantially the same.

* * * * *